(12) United States Patent
Park et al.

(10) Patent No.: US 7,672,463 B2
(45) Date of Patent: Mar. 2, 2010

(54) APPARATUS TO CONTROL TEMPERATURE OF AUDIO AMP

(75) Inventors: Hae-kwang Park, Seoul (KR); Young-suk Song, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 1310 days.

(21) Appl. No.: 10/990,975

(22) Filed: Nov. 18, 2004

(65) Prior Publication Data

US 2005/0111669 A1    May 26, 2005

(30) Foreign Application Priority Data

Nov. 25, 2003    (KR)    .................. 10-2003-0084186

(51) Int. Cl.
*H03G 11/00*    (2006.01)

(52) U.S. Cl. .................................. 381/55; 381/189

(58) Field of Classification Search ............... 381/58, 381/56, 55, 1, 28, 98, 189, 124, 123, 120, 381/121; 700/94; 236/49.3; 455/184; 361/103; 330/251, 254, 281, 125 R, 298, 207 P
See application file for complete search history.

(56) References Cited

U.S. PATENT DOCUMENTS

| | | | | |
|---|---|---|---|---|
| 4,509,088 A | * | 4/1985 | Profio | 361/29 |
| 6,494,381 B2 | * | 12/2002 | Bulthuis | 236/49.3 |
| 6,608,906 B2 | * | 8/2003 | Krochmal et al. | 381/189 |
| 6,987,370 B2 | * | 1/2006 | Chheda et al. | 318/400.08 |
| 7,082,772 B2 | * | 8/2006 | Welch | 62/3.2 |
| 7,088,565 B2 | * | 8/2006 | Watanabe et al. | 361/103 |
| 2002/0079375 A1 | | 6/2002 | Bulthuis | |
| 2003/0138115 A1 | | 7/2003 | Krochman | |

FOREIGN PATENT DOCUMENTS

| | | |
|---|---|---|
| JP | 2001-168646 | 6/2001 |
| JP | 2003-033078 | 1/2003 |
| JP | 2003-069909 | 3/2003 |
| KR | 20-222443 | 2/2001 |

OTHER PUBLICATIONS

Korean Office Action issued Oct. 29, 2009 in KR Application No. 2003-0084186.

* cited by examiner

*Primary Examiner*—Vivian Chin
*Assistant Examiner*—Lun-See Lao
(74) *Attorney, Agent, or Firm*—Stanzione & Kim LLP

(57) ABSTRACT

A temperature control apparatus used with an audio amp to prevent the audio amp from overheating and noise from being generated by effectively controlling a cooling fan of the audio amp includes a power supply to supply an electrical power, a power amp to amplify an input audio signal using the electrical power supplied from the power supply, a signal detector to detect the amount of the current flowing from the power supply during a predetermined time, a temperature sensor to sense a temperature over a predetermined level generated from the power amp, and a micro controller to control a cooling fan according to the amount of current output from the signal detector and/or the temperature sensed by the temperature sensor.

19 Claims, 4 Drawing Sheets

APPARATUS TO CONTROL TEMPERATURE OF AUDIO AMP

CROSS-REFERENCE TO RELATED APPLICATIONS

This application claims the priority of Korean Patent Application No. 2003-84186, filed on Nov. 25, 2003, in the Korean Intellectual Property Office, the disclosure of which is incorporated herein in its entirety by reference.

BACKGROUND OF THE INVENTION

1. Field of the Invention

The present general inventive concept relates to an audio amp system, and more particularly, to a temperature control apparatus used with an audio amp to prevent the audio amp from overheating and generating noise by effectively controlling a cooling fan of an audio amp system.

2. Description of the Related Art

Commonly, an audio amp amplifies an audio signal to a power signal having a predetermined level. At this time, when an audio output power is high, heat is generated in the audio amp. The heat generated in the audio amp badly affects internal circuits and, in a severe case, may cause a malfunction of the audio amp and a security problem. In an audio system, a cooling fan is used to prevent the audio amp from overheating. However, when the cooling fan operates, considerable noise is generated, and eventually, entire sound quality is deteriorated.

To solve these problems, a cooling fan control strategy for an audio amp in a conventional overheat prevention system is disclosed in U.S. Publication No. 2003/0138115 A1 (U.S. patent application. Ser. No. 10/034,049, filed on Dec. 27, 2001).

FIG. 1 is a block diagram of a conventional temperature control apparatus of an audio amp.

Referring to FIG. 1, a power supply 110 supplies power to a power amp 120 and other blocks. If an audio signal is input to the power amp 120, the power amp 120 operates normally. If a level of the audio signal is maintained high for a predetermined time, an internal temperature of the power amp 120 becomes high.

When the temperature is over a predetermined level, a temperature sensor 130 attached to the power amp 120 transmits an overheating signal to a micro controller 140 or a cooling fan driver 150.

The micro controller 140 or the cooling fan driver 150 drives a cooling fan 160 to prevent the audio amp from overheating. When the cooling fan 160 operates, air ventilates an inside of the audio amp, the internal temperature of the power amp 120 becomes low, and the overheating is prevented.

However, a process of the temperature sensor 130 to detect the overheating of the power amp 120 and transmit the overheating signal to the micro controller 140 is too slow and not precise. Also, when the temperature sensor 130 transmits the overheating signal to the micro controller 140, the audio amp 120 has already malfunctioned or sound quality has dramatically been deteriorated due to distortion of output signals of the audio amp 120.

Besides the overheat prevention system of the audio amp shown in FIG. 1, there is a cooling fan control method using a level of a volume. In this method, a cooling fan always rotates whenever the level of the volume is high even if speakers are not connected to an audio amp. However, since overheating is not generated no matter how high the volume may be if the speakers are not connected to the audio amp, it is unnecessary to operate the cooling fan. Also, even though the speakers are connected to the audio amp, since the generated heat capacity varies according to the number of connected speakers, it is difficult to precisely control the cooling fan.

SUMMARY OF THE INVENTION

In order to solve the foregoing and/or other problems, it is an aspect of the present general inventive concept to provide a temperature control apparatus used with an audio amp to prevent the audio amp from overheating and to minimize noise generated from a cooling fan by effectively controlling the cooling fan in the audio amp.

Additional aspects and advantages of the present general inventive concept will be set forth in part in the description which follows and, in part, will be obvious from the description, or may be learned by practice of the general inventive concept.

The foregoing and/or other aspects of the present general inventive concept, may be achieved by providing a temperature control apparatus used with an audio amp in an audio system to reproduce audio signals, the apparatus comprising a power supply to supply an electrical power, a power amp to amplify an input audio signal using the electrical power supplied from the power supply, a signal detector to detect an amount of a current flowing from the power supply during a predetermined time, a temperature sensor to sense a temperature over a predetermined level generated from the power amp, and a micro controller to control a cooling fan according to the amount of the current output from the signal detector and/or a value of temperature sensed by the temperature sensor.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
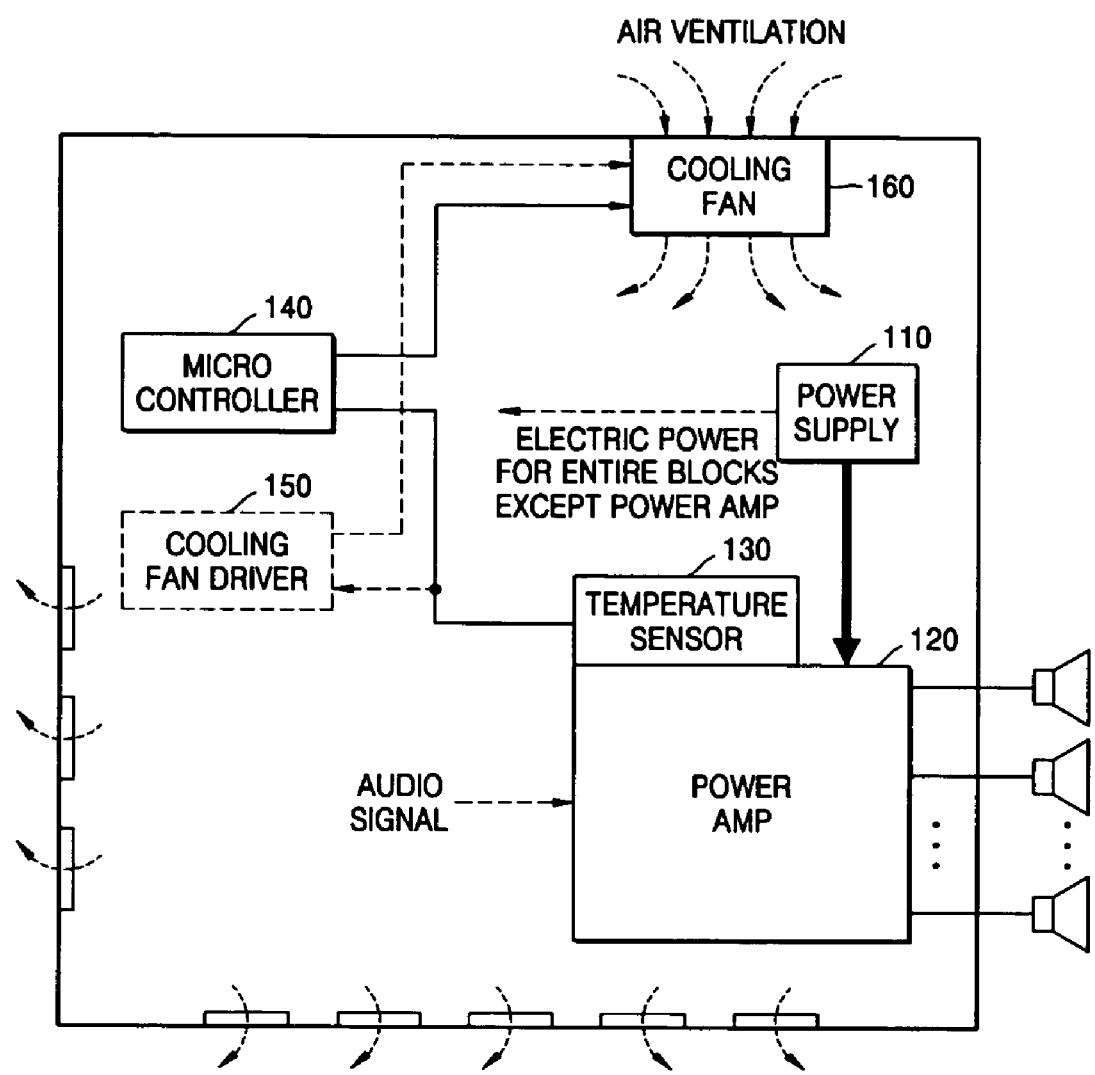
FIG. 1 is a block diagram of a conventional temperature control apparatus of an audio amp.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

An audio amp system overheats when a power amp amplifies an input signal too much. That is, the overheating is generated when a current flowing from a power supply of an entire system to the power amp is too large.

A total heat generated from the power amp during a time unit can be represented by Equation 1.

$$Q \sim \propto \sim Load\_power \times (I\_power)^2 + Load\_system \times (I\_system)^2 \quad \text{[Equation 1]}$$

Here, Q indicates the total heat generated during a time unit, Load_power indicates a total load of the power amp, I_power indicates a current flowing to the power amp, Load_system indicates a total load of other components of an audio amp system except the power amp, and I_system indicates a current flowing to the other system.

As shown in Equation 1, it can be seen that the heat (Load_system*I_system) generated by the other system except the power amp can be almost constant. Also, since the total load (Load_power) of the power amp is constantly fixed, the total heat generated at a moment can be calculated by calculating an amount of current (I_power) flowing to the power amp.

Figure 2:
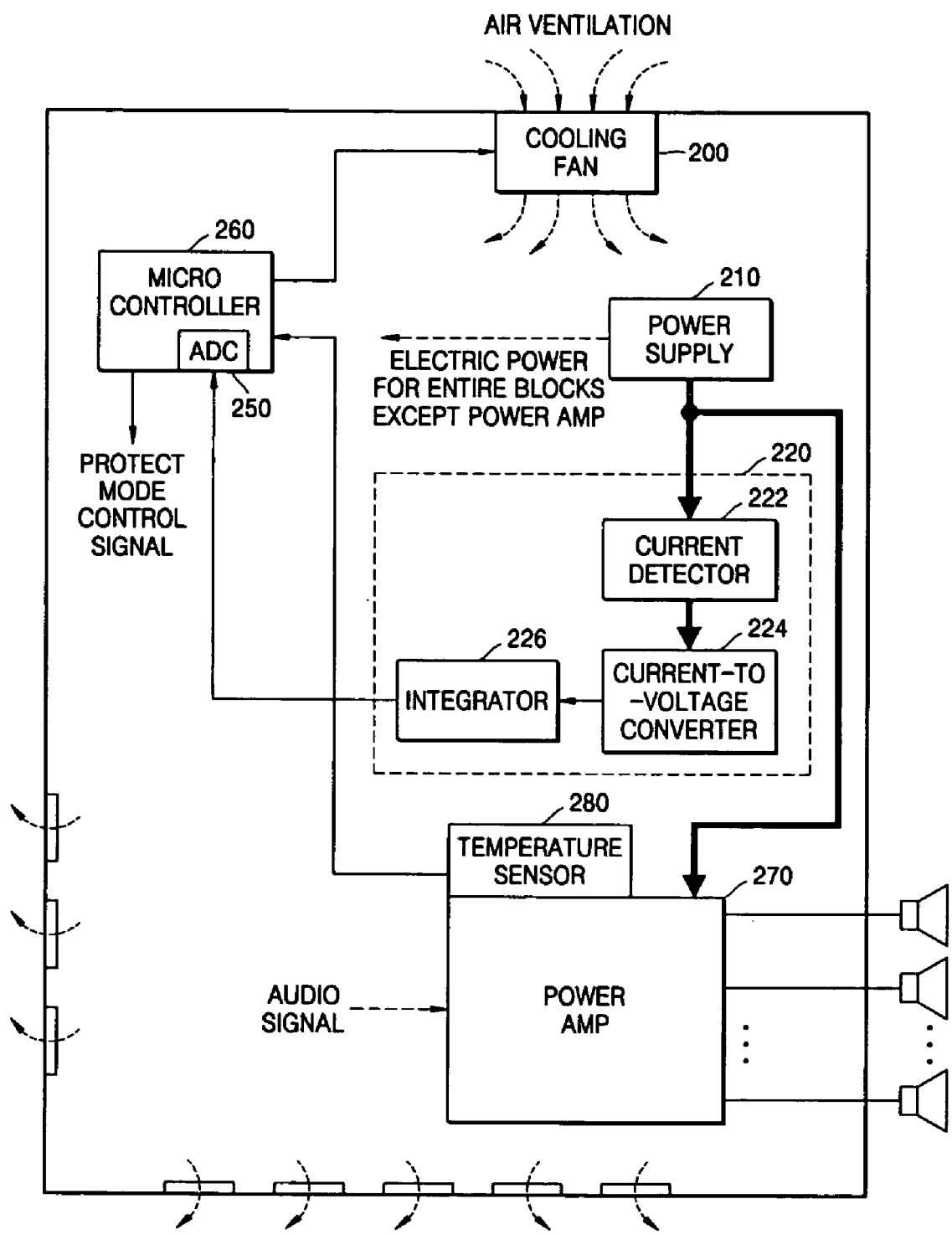
FIG. 2 is a block diagram illustrating a temperature control apparatus used with an audio amp according to an embodiment of the present general inventive concept.

FIG. 2 is a block diagram of a temperature control apparatus used with an audio amp of an audio system according to an embodiment of the present general inventive concept.

Referring to FIG. 2, the temperature control apparatus may include a power supply 210, a power amp 270 with a temperature sensor 280 attached to a predetermined location thereof, a micro controller 260 including an analog-to-digital converter (ADC) 250, a cooling fan 200 cooling the power amp 270 by circulating air, and a signal detector 220 to calculate a heat generated during a predetermined time. The signal detector 220 may include a current detector 222, a current-to-voltage converter 224, and an integrator 226.

A method of controlling the cooling fan 200 using a current flowing to the power amp 270 and the temperature sensor 280 will now be separately described with reference to FIG. 2.

First, the method of controlling the cooling fan 200 using the current flowing to the power amp 270 will be described.

The power supply 210 can supply an electrical power to each block of the audio system including the power amp 270.

The current detector 222 can detect a current flowing from the power supply 210. In an aspect of the present general inventive concept, the current detector 222 can detect the current by using shunt resistors.

The current-to-voltage converter 224 can convert the current detected by the current detector 222 into a voltage signal. As an aspect of the present general inventive concept, the current-to-voltage converter 224 can include resistances.

The integrator 226 can obtain an amount of the current flowing during a predetermined time by integrating the voltage of the current-to-voltage signal converter 224 during the predetermined time.

The ADC 250 can convert an analog pattern of the voltage signal integrated by the integrator 226 into a digital pattern to generate a voltage value.

When the micro controller 260 senses that the voltage value of the digital pattern outputted from the ADO 250 is over a predetermined level, the micro controller 260 can predict overheating and can control the cooling fan 200 to operate. Also, after the cooling fan 200 operates for a second predetermined time, the micro controller 260 can control the cooling fan 200 to continuously operate if the micro controller 260 senses that the voltage value converted into the digital pattern by the ADC 250 is over the predetermined level, and can control the cooling fan 200 to stop operating if the micro controller 260 senses that the voltage value of the digital pattern outputted from the ADC 250 is not over the predetermined level. When an inside of the audio system is ventilated by the cooling fan 200, an internal temperature of the power amp 270 becomes low since air is introduced into the inside to cool the audio amp 270, so that the overheating is prevented.

Next, a dual security method of controlling the cooling fan 200 using the temperature sensor 280 will be described.

When the internal temperature of the power amp 270 is continuously high due to another unpredictable reason even though the cooling fan 200 has fully operated by detecting the current of the power amp 270, the cooling fan 200 can be controlled using the temperature sensor 280.

That is, the temperature sensor 280 can sense whether a temperature of the power amp 270 is over a predetermined level due to an excessive output of the power amp 270, to generate a sensing signal.

The micro controller 260 can generate a protect mode control signal or a cooling fan control signal according to the sensing signal from the temperature sensor 280 and an integrated voltage value of the integrator 226.

Figure 3:
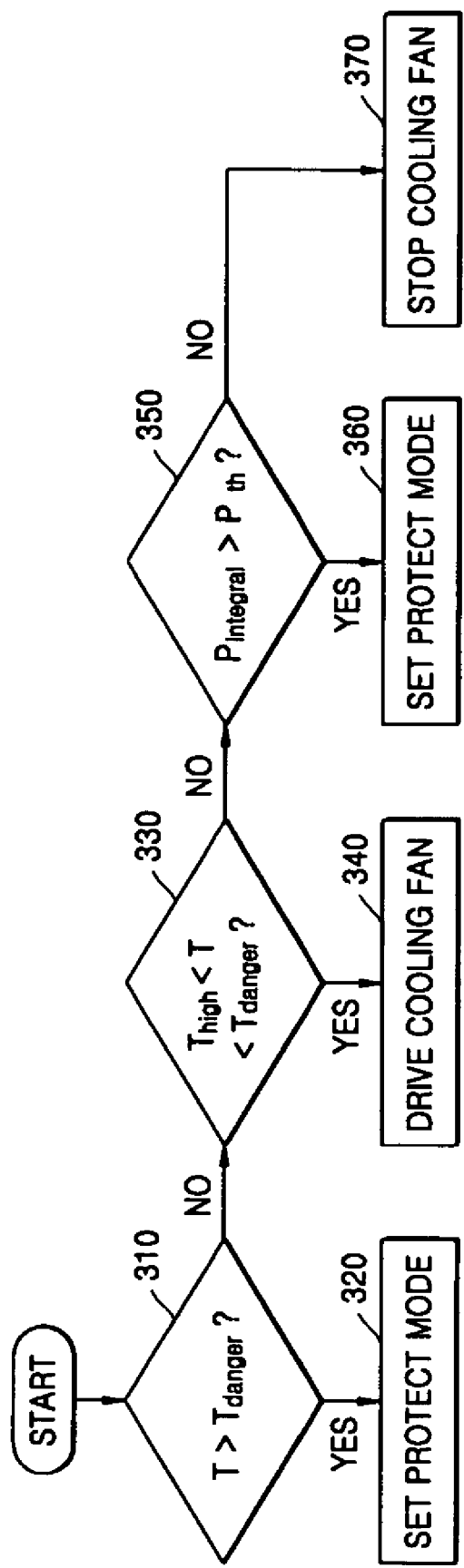
FIG. 3 is a control sequence diagram illustrating a method of controlling a cooling fan and a protect mode according to output signals of a temperature sensor and an integrator of FIG. 2.
Figure 4:
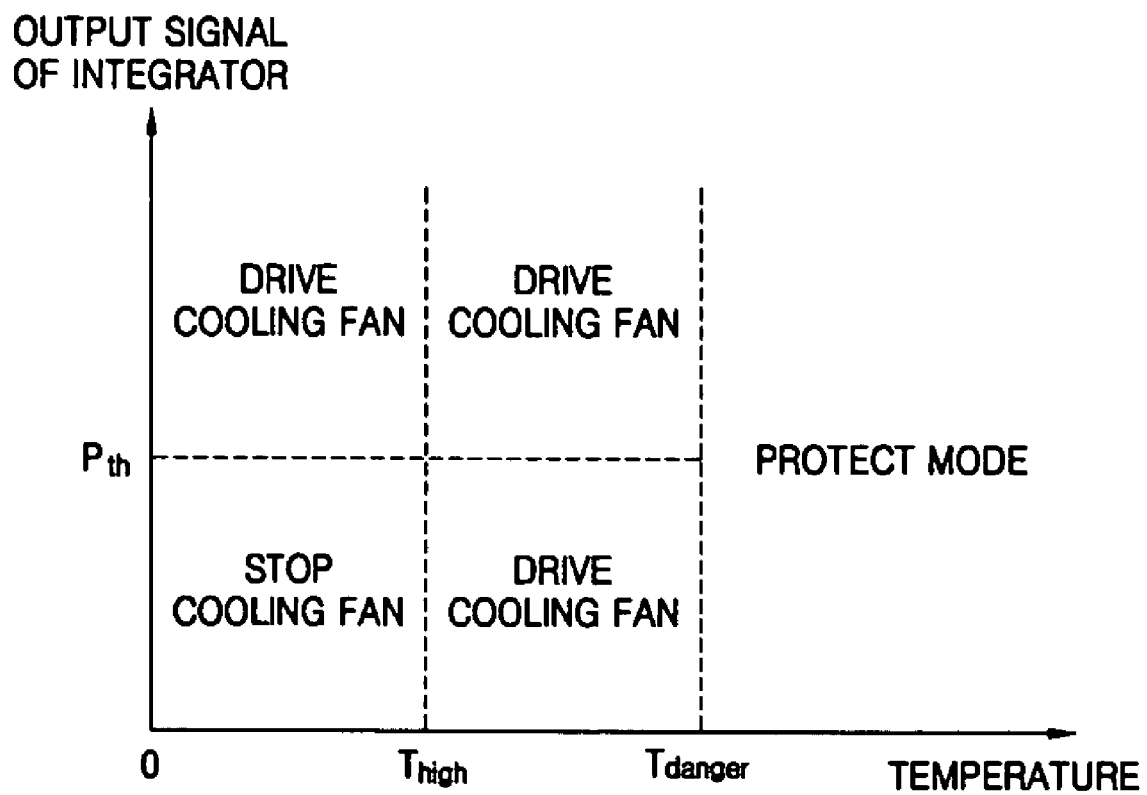
FIG. 4 is a control graph illustrating a method of controlling the cooling fan and the protect mode according to the output signals of the temperature sensor and the integrator of FIGS. 2 and 3.

FIG. 3 is a control sequence diagram illustrating a method of controlling the cooling fan 200 and a protect mode according to output signals of the temperature sensor 280 and the integrator 226 of FIG. 2. FIG. 4 is a graph illustrating a method of controlling the cooling fan 200 and the protect mode according to the output signals of the temperature sensor 280 and the integrator 226. When the protective mode is set, the cooling fan 270 can be operated according to both of the output signals of the temperature sensor 280 and the signal detector 220. The cooling 270 can be continuously operated until the output signals of the temperature sensor 280 and the signal detector 220 is less than reference values.

Referring to FIGS. 2, 3 and 4, when a temperature T sensed by the temperature sensor 280 is larger than a first set temperature $T_{danger}$ in operation 310, the protect mode can be set in operation 320.

Also, when the temperature T sensed by the temperature sensor 280 is smaller than the first set temperature $T_{danger}$ and larger than a second set temperature $T_{high}$ in operation 330, the cooling fan 200 can be driven in operation 340.

Also, when the temperature T sensed by the temperature sensor 280 is smaller than the second set temperature $T_{high}$ and when a power value $P_{integral}$ input from the integrator 226 to the micro controller is larger than a predetermined level $P_{th}$ in operation 350, the cooling fan 200 can be driven in operation 360.

Otherwise, the cooling fan 200 can be stopped in operation 370.

As described above, according to an aspect of the present general inventive concept, distortion of a sound quality of an audio system can be prevented since an audio amp is prevented from overheating by operating a cooling fan before the audio amp is overheated. Also, the cooling fan can be controlled by automatically sensing whether speakers are connected to a power amp using a current flowing to the power amp. Also, a dual safety apparatus can be realized using a power signal output from an integrator and a temperature sensing signal output from a temperature sensor. That is, performance and safety of the audio system can be may improved by simultaneously using the power signal and the temperature sensing signal to control the cooling fan and by performing the protect mode when the audio system is in danger due to a high temperature.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A temperature control apparatus used with an audio amp in an audio system to reproduce audio signals, the apparatus comprising;

a power supply to supply electrical power;

a power amp to amplify an input audio signal using the electrical power supplied from the power supply;

a temperature sensor to sense a temperature over a predetermined level generated from the power amp;

a signal detector to detect an amount of a current flowing from the power supply to the power amp during a predetermined time under a condition that the power amp operates when the temperature sensed by the temperature sensor is over the predetermined level, and to convert the detected current into a voltage; and a micro controller to control a cooling fan to stop when the voltage is lower than a predetermined level, and to control the fan by sensing whether speakers are connected to the power amp using a current flowing to the power amp.

2. The apparatus of claim 1, wherein the signal detector comprises:

a current detector to detect the current flowing from the power supply;

a current-to-voltage converter to convert the current detected by the current detector into the voltage; and an integrator to extract the signal corresponding to the amount of the current flowing during the predetermined time by integrating the voltage converted by the current-to-voltage converter.

3. The apparatus of claim 2, wherein a voltage value of the integrator is given by the amount of the current flowing to the power amp.

4. The apparatus of claim 1, wherein the temperature sensor is disposed on a predetermined location of the power amp.

5. The apparatus of claim 1, further comprising:

an analog-to-digital converter to convert the voltage value of the integrator into a digital value and to transmit the converted digital value to the micro controller, wherein the micro controller controls the cooling fan according to the converted digital value.

6. The apparatus of claim 1, wherein a protect mode is set when a temperature sensed by the temperature sensor is larger than a first set temperature, the micro controller controls the cooling fan to operate when the temperature is smaller than the first set temperature and larger than a second set temperature, and the micro controller controls the cooling fan to operate when the temperature is smaller than the second set temperature and a voltage value of the integrator is larger than a predetermined level.

7. A temperature control apparatus used with an audio amp in an audio system to reproduce an audio signal, the apparatus comprising:

a power supply to supply electrical power;

a power amp to amplify an input audio signal using the electrical power supplied from the power supply;

a temperature sensor to sense a temperature of the power amp;

a signal detector to detect an amount of a current of the electrical power when the temperature sensed by the temperature sensor is over a predetermined level and to convert the detected current into a voltage;

a cooling fan to cool the power amp; and a controller to control the cooling fan to stop when the voltage is lower than a predetermined value, and control the fan by sensing whether speakers are connected to the power amp using a current flowing to the power amp.

8. The apparatus of claim 7, wherein the controller controls the cooling fan to be set in a protect mode when the sensed temperature is higher than a first reference temperature, and when the voltage is greater than a predetermined value.

9. The apparatus of claim 8, wherein the controller controls the cooling fan to continue to operate until the sensed temperature is lower than the first reference temperature.

10. The apparatus of claim 8, wherein the controller controls the cooling fan to continue to operate until the sensed temperature is lower than a second reference temperature, and lower than the first reference temperature.

11. The apparatus of claim 8, wherein the controller controls the cooling fan to continue to operate until the voltage is lower than the predetermined value when the sensed temperature is lower than the first reference temperature.

12. The apparatus of claim 7, wherein the controller further controls the cooling fan to stop operating when the sensed temperature is lower than a first reference temperature.

13. The apparatus of claim 7, wherein the controller controls the cooling fan to be set in a protect mode when the sensed temperature is lower than a first reference temperature and lower than a second reference temperature, and the voltage is greater than a predetermined value.

14. The apparatus of claim 13, wherein the controller further controls the cooling fan to continue to operate until the sensed temperature is lower than a second reference temperature, and lower than the first reference temperature.

15. A method of controlling a temperature of an audio amp in an audio system to reproduce an audio signal, the method comprising:

supplying an electrical power from a power supply to an audio amp to amplify an input audio signal using the electrical power supplied from the power supply;

sensing a temperature of the power amp using a temperature sensor;

detecting an amount of a current of the electrical power in a signal detector when the temperature sensed by the temperature sensor is over a predetermined level;

converting the detected current into a voltage; and controlling a cooling fan, using a micro controller, to stop cooling the audio amp when the voltage is lower than a predetermined level, and to control the fan by sensing whether speakers are connected to the power amp using a current flowing to the power amp.

16. The method of claim 15, wherein the controlling of the cooling fan comprises:

controlling the cooling fan to be set in a protect mode when the sensed temperature is higher than a first reference temperature, and when the voltage is greater than a predetermined value.

17. The method of claim 16, wherein the controlling of the cooling fan comprises:

controlling the cooling fan to continue to operate until the sensed temperature is lower than the first reference temperature.

18. The method of claim 15, wherein the controlling of the cooling fan comprises:

controlling the cooling fan to operate when the sensed temperature is higher than a first reference temperature.

19. The method of claim 15, wherein the controlling of the cooling fan comprises:

controlling the cooling fan to be set in a protect mode when the sensed temperature is lower than a first reference temperature and lower than a second reference temperature, and the voltage is greater than a predetermined value, so that the cooling fan continues to operate until the sensed temperature is lower than the second reference temperature and lower than the first reference temperature, and the voltage is less than the predetermined value.

* * * * *